US007633353B2

(12) United States Patent
Okabe

(10) Patent No.: US 7,633,353 B2
(45) Date of Patent: Dec. 15, 2009

(54) BALUN CIRCUIT AND FREQUENCY CONVERTING APPARATUS

(75) Inventor: Hideyuki Okabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 115 days.

(21) Appl. No.: 11/875,961

(22) Filed: Oct. 22, 2007

(65) Prior Publication Data

US 2009/0102576 A1 Apr. 23, 2009

(51) Int. Cl.
*H03H 7/42* (2006.01)
*H01P 5/04* (2006.01)

(52) U.S. Cl. ....................................... 333/26; 333/24 R

(58) Field of Classification Search ................... 333/25, 333/26, 238, 246, 24 R
See application file for complete search history.

(56) References Cited

U.S. PATENT DOCUMENTS 5,061,910 A * 10/1991 Bouny .......................... 333/26
5,497,137 A * 3/1996 Fujiki .......................... 336/200
6,094,570 A * 7/2000 Consolazio ................. 455/327
6,351,192 B1 * 2/2002 Sheen .......................... 333/26
6,844,792 B1 * 1/2005 Koeppe et al. ............ 333/24 R

FOREIGN PATENT DOCUMENTS

JP 2002-232215 8/2002

* cited by examiner

*Primary Examiner*—Dean O Takaoka
(74) *Attorney, Agent, or Firm*—Osha • Liang LLP

(57) ABSTRACT

A balun circuit is provided that includes a first coupling line in which an unbalanced line thereof is connected to a first terminal and a balanced line thereof is electrically connected to a second terminal, a second coupling line in which an unbalanced line thereof is electrically connected to the unbalanced line of the first coupling line and a balanced line thereof is electrically connected to a third terminal, a first transmission path that is serially connected between the balanced line of the first coupling line and a ground potential, a second transmission path that is serially connected between the balanced line of the second coupling line and a ground potential, and a third transmission path that is serially connected between the unbalanced line of the first coupling line and the unbalanced line of the second coupling line. These transmission lines are formed such that an amplitude characteristic of S12 is the same as an amplitude characteristic of S13 and a phase characteristic of S12 is inverted in relation to a phase characteristic of S13.

10 Claims, 3 Drawing Sheets

(a)

(b)

BALUN CIRCUIT AND FREQUENCY CONVERTING APPARATUS

BACKGROUND

1. Technical Field

The present invention relates to a balun circuit and a frequency converting apparatus and, more particularly, the present invention relates to a balun circuit disposed between a first terminal, a second terminal, and a third terminal and a frequency converting apparatus that outputs a modulated signal obtained by shifting a frequency of a signal to be modulated according to a frequency of a local signal.

2. Related Art

A balun circuit is conventionally known as a circuit that generates a differential signal. For example, the balun circuit generates the differential signal through a signal output by two coupling lines connected in a cascading manner as in, for example, Japanese Patent Application Publication No. 2002-232215 (Patent Document 1).

Each coupling line includes an unbalanced line and a balanced line. The unbalanced line in each coupling line is disposed as a single continuous line. Furthermore, the balanced line in each coupling line is disposed parallel to the corresponding unbalanced line.

A signal transmitted by each unbalanced line is propagated to and received by the corresponding balanced line through magnetic coupling or the like and is then output to the outside. At this time, if a line length of each coupling line is a quarter of a wavelength of the transmission signals, differential signals differing in phase by 180 degrees are output from the coupling lines. Furthermore, the levels of the signals output by the balanced lines are determined by the levels of the signals transmitted by the corresponding unbalanced lines and an amount of coupling with the unbalanced lines.

A signal transmitted by the unbalanced line of a front coupling line is provided to a rear coupling line. Because of this, there is a case where the level of the signal provided to the front coupling line is different from the level of the signal provided to the rear coupling line because of signal decay or the like caused by the transmission. In such a case, when the coupling amount in each coupling line is set to be equal, the levels of the signals propagated to the balanced line of each coupling line are undesirably different. In other words, the signal levels of an inverted side and a noninverted side in the differential signal generated by the balun circuit are undesirably different.

In response to the problem of the levels of signals on the inverted side and the noninverted side being different, adjusting the levels of the signals output by each of the balanced lines by adjusting the coupling amount of each coupling line has been considered. For example, by adjusting the line widths of the unbalanced lines and the balanced lines included in the coupling lines, the coupling amount in the coupling lines is adjusted, so that the signal levels can also be adjusted.

However, there are cases where it is difficult to adjust the line width in each coupling line. For example, in a case where the balun circuit is formed on a semiconductor substrate or the like, it is difficult to dispose in a straight line a coupling line that has a line length that is one quarter of the wavelength of the transmission signal. In view of this, a prescribed line length can be ensured by forming each line of the coupling line in a spiral shape, a kinked line shape, or the like.

However, during formation of the wiring having a pattern that includes a curved portion or a kinked portion, it is desirable that the line width of the pattern wiring be uniform and smaller than a prescribed width. Therefore, with the method that adjusts the line width, the signal level of the inverted side and the noninverted side in the differential signal cannot be sufficiently adjusted.

SUMMARY

Therefore, it is an object of an aspect of the present invention to provide a balun circuit and a frequency converting apparatus, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary apparatus may include a balun circuit disposed between a first terminal, a second terminal, and a third terminal. The balun circuit includes a first coupling line in which an unbalanced line thereof is connected to the first terminal and a balanced line thereof is electrically connected to the second terminal, a second coupling line having characteristics identical to those of the first coupling line in which an unbalanced line thereof is electrically connected to the unbalanced line of the first coupling line and a balanced line thereof is electrically connected to the third terminal, a first transmission path that is serially connected between the balanced line of the first coupling line and a ground potential, a second transmission path that is serially connected between the balanced line of the second coupling line and a ground potential, and a third transmission path that is serially connected between the unbalanced line of the first coupling line and the unbalanced line of the second coupling line. In the balun circuit, the first transmission path, the second transmission path, and the third transmission path are formed in a manner such that an amplitude characteristic from among the signal passing characteristics from the first terminal to the second terminal is the same as an amplitude characteristic of the signal passing characteristics from the first terminal to the third terminal and such that a phase characteristic from among the signal passing characteristics from the first terminal to the second terminal is a characteristic having an inverted phase in relation to a phase characteristic of the signal passing characteristics from the first terminal to the third terminal.

According to a second aspect related to the innovations herein, one exemplary apparatus may include a balun circuit disposed between a first terminal, a second terminal, and a third terminal. The balun circuit includes a first coupling line in which an unbalanced line thereof is connected to the first terminal and a balanced line thereof is electrically connected to the second terminal, a second coupling line having characteristics identical to those of the first coupling line in which an unbalanced line thereof is electrically connected to the unbalanced line of the first coupling line and a balanced line thereof is electrically connected to the third terminal, a first transmission path that is serially connected between the balanced line of the first coupling line and a ground potential, a second transmission path that is serially connected between the balanced line of the second coupling line and a ground potential, and a third transmission path that is serially connected between the unbalanced line of the first coupling line and the unbalanced line of the second coupling line. In the balun circuit, the first transmission path, the second transmission path, and the third transmission path are formed in a manner such that an amplitude characteristic from among the signal passing characteristics from the second terminal to the first terminal is the same as an amplitude characteristic of the signal passing characteristics from the third terminal to the first terminal and such that a phase characteristic from among the signal passing characteristics from the second terminal to the first terminal is a characteristic having an inverted phase in relation to a phase characteristic of the signal passing characteristics from the third terminal to the first terminal.

According to a third aspect related to the innovations herein, one exemplary apparatus may include a frequency converting apparatus that outputs a modulated signal obtained by shifting a frequency of a signal to be modulated according to a frequency of a local signal. The frequency converting apparatus includes a first signal input section that receives the signal to be modulated, a second signal input section that receives the local signal, a mixer that modulates the signal to be modulated based on the local signal, and a signal output section that outputs the modulated signal based on the signal generated by the mixer. In the frequency converting apparatus, at least one of the first signal input section and the second signal input section is a balun circuit disposed between a first terminal, a second terminal, and a third terminal. The balun circuit in the frequency converting apparatus includes a first coupling line in which an unbalanced line thereof is connected to the first terminal and a balanced line thereof is electrically connected to the second terminal, a second coupling line having characteristics identical to those of the first coupling line in which an unbalanced line thereof is electrically connected to the unbalanced line of the first coupling line and a balanced line thereof is electrically connected to the third terminal, a first transmission path that is serially connected between the balanced line of the first coupling line and a ground potential, a second transmission path that is serially connected between the balanced line of the second coupling line and a ground potential, and a third transmission path that is serially connected between the unbalanced line of the first coupling line and the unbalanced line of the second coupling line. In the balun circuit of the frequency converting apparatus, the first transmission path, the second transmission path, and the third transmission path are formed in a manner such that an amplitude characteristic from among the signal passing characteristics from the first terminal to the second terminal is the same as an amplitude characteristic of the signal passing characteristics from the first terminal to the third terminal and such that a phase characteristic from among the signal passing characteristics from the first terminal to the second terminal is a characteristic having an inverted phase in relation to a phase characteristic of the signal passing characteristics from the first terminal to the third terminal.

According to a fourth aspect related to the innovations herein, one exemplary apparatus may include a frequency converting apparatus that outputs a modulated signal obtained by shifting a frequency of a signal to be modulated according to a frequency of a local signal. The frequency converting apparatus includes a first signal input section that receives the signal to be modulated, a second signal input section that receives the local signal, a mixer that modulates the signal to be modulated based on the local signal, and a signal output section that outputs a modulated signal based on the signal generated by the mixer. In the frequency converting apparatus, the signal output section is a balun circuit disposed between a first terminal, a second terminal, and a third terminal. The balun circuit in the frequency converting apparatus includes a first coupling line in which an unbalanced line thereof is connected to the first terminal and a balanced line thereof is electrically connected to the second terminal, a second coupling line having characteristics identical to those of the first coupling line in which an unbalanced line thereof is electrically connected to the unbalanced line of the first coupling line and a balanced line thereof is electrically connected to the third terminal, a first transmission path that is serially connected between the balanced line of the first coupling line and a ground potential, a second transmission path that is serially connected between the balanced line of the second coupling line and a ground potential, and a third transmission path that is serially connected between the unbalanced line of the first coupling line and the unbalanced line of the second coupling line. In the balun circuit of the frequency converting apparatus, the first transmission path, the second transmission path, and the third transmission path are formed in a manner such that an amplitude characteristic from among the signal passing characteristics from the second terminal to the first terminal is the same as an amplitude characteristic of the signal passing characteristics from the third terminal to the first terminal and such that a phase characteristic from among the signal passing characteristics from the second terminal to the first terminal is a characteristic having an inverted phase in relation to a phase characteristic of the signal passing characteristics from the third terminal to the first terminal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2(*b*) shows an exemplary configuration of a first balanced line 114 and a first transmission path 140.

FIG. 3(*b*) shows another example of a balun circuit.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
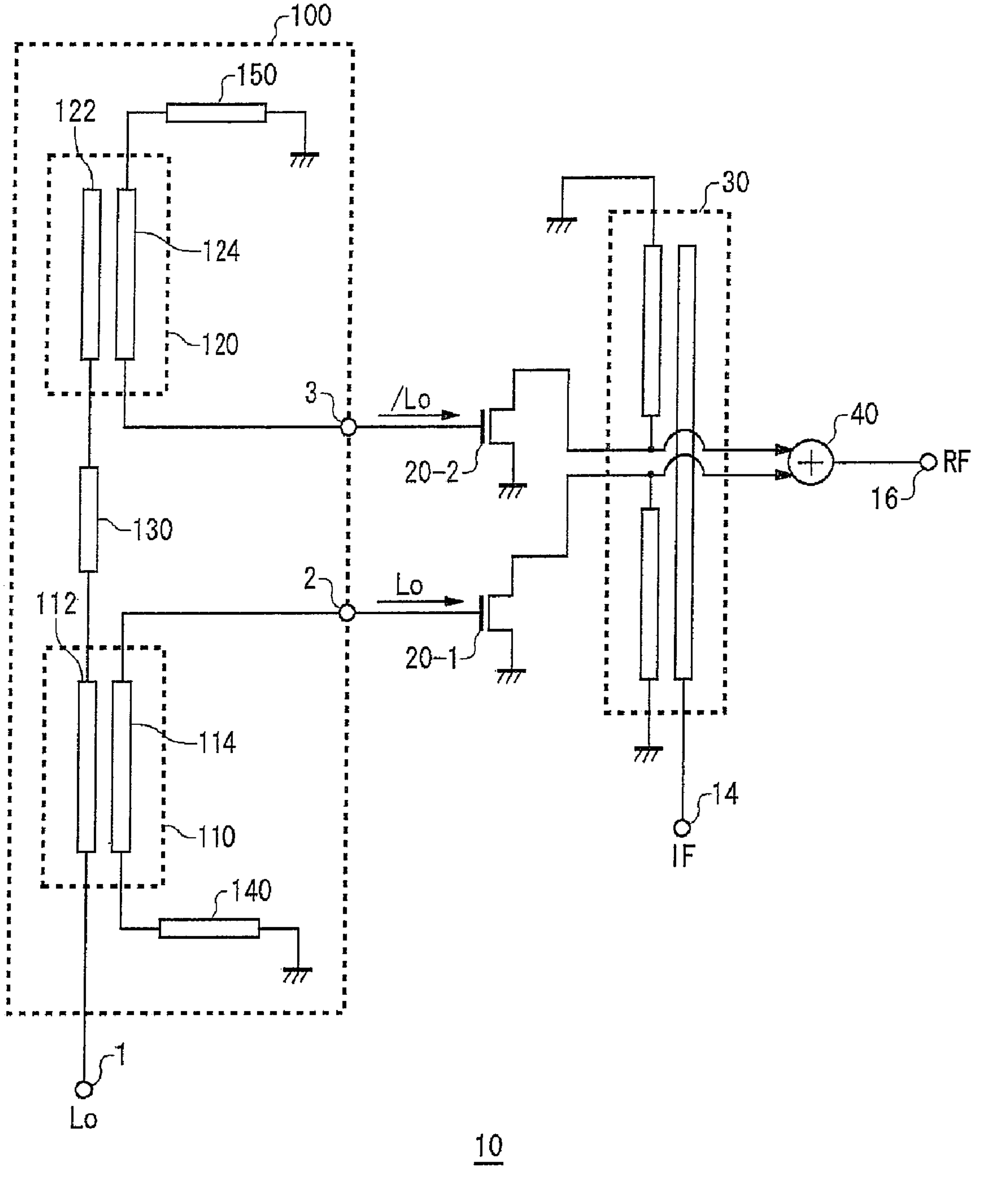
FIG. 1 shows an exemplary configuration of a frequency converting apparatus 10 according to an embodiment of the present invention.

FIG. 1 shows an exemplary configuration of a frequency converting apparatus 10 according to an embodiment of the present invention. The frequency converting apparatus 10 outputs a modulated signal RF obtained by shifting a frequency of a signal to be modulated IF with a frequency of a local signal Lo. The frequency converting apparatus 10 may be formed on a semiconductor substrate, for example. The frequency converting apparatus 10 of the present embodiment is provided with a balun circuit 100, a first mixer 20-1, a second mixer 20-2, a first signal input section 30, and an output section 40.

The balun circuit 100 may function as a second signal input section that outputs a first output signal and a second output signal based on the local signal Lo supplied as the input signal. The first output signal may be the local signal Lo and the second output signal may be an inverted local signal /Lo. The inverted local signal /Lo may be a signal obtained by inverting the local signal Lo. For example, the inverted local signal /Lo may be a signal obtained by shifting a phase of the local signal Lo by 180 degrees.

The first mixer 20-1 modulates the signal to be modulated IF based on the local signal Lo. The first mixer 20-1 of the present embodiment outputs a signal obtained by multiplying the signal to be modulated IF by the local signal Lo. The first mixer 20-1 may be a transistor in which the gate terminal receives the local signal Lo, the drain terminal receives the signal to be modulated IF, the source terminal is grounded, and the drain terminal is connected to the output section 40.

The second mixer 20-2 modulates the inverted signal to be modulated, which is obtained by inverting the signal to be modulated IF, based on the inverted local signal. The second mixer 20-2 of the present embodiment outputs a signal obtained by multiplying the inverted signal to be modulated by the inverted local signal /Lo. The second mixer 20-2 may be a transistor in which the gate terminal receives the inverted local signal /Lo, the drain terminal receives the inverted signal to be modulated, the source terminal is grounded, and the drain terminal is connected to the output section 40.

The first signal input section 30 receives the signal to be modulated IF and outputs the signal to be modulated IF and the inverted signal to be modulated. The first signal input section 30 may have the same function and configuration as the balun circuit 100. The first signal input section 30 may be connected to the drain terminal of the first mixer 20-1 and the drain terminal of the second mixer 20-2.

The output section 40 outputs the modulated signal RF based on the signals output by the first mixer 20-1 and the second mixer 20-2. The output section 40 may output as the modulated signal RF a signal obtained by adding the signal output by the first mixer 20-1 and the signal output by the second mixer 20-2. Through such a configuration, the frequency converting apparatus 10 can generate the modulated signal RF.

The balun circuit 100 is disposed between the first terminal 1, the second terminal 2, and the third terminal 3 and is provided with a first coupling line 110, a second coupling line 120, a first transmission path 140, a second transmission path 150, and a third transmission path 130. The first coupling line 110 supplies the local signal Lo to the first mixer 20-1 based on the local signal Lo provided from the first terminal 1. The first coupling line 110 includes a first unbalanced line 112 and a first balanced line 114.

The first unbalanced line 112 has one end thereof electrically connected to the first terminal 1 and receives the local signal Lo. Here, in FIG. 1, the first terminal 1 is shown as being separated from the first unbalanced line 112, but the first terminal 1 may be an end portion of the first unbalanced line 112. Furthermore, the other end of the first unbalanced line 112 is electrically connected to the third transmission path 130. The first balanced line 114 is disposed together with the first unbalanced line 112 to form the first coupling line 110. For example, the first balanced line 114 is formed parallel to the first unbalanced line 112 with a prescribed distance therebetween.

One end of the first balanced line 114 on a side of the first terminal 1 is electrically connected to a ground potential via the first transmission path 140 and the other end of the first balanced line 114 is electrically connected to the first mixer 20-1 via the second terminal 2. Here, the second terminal 2 may be an end portion of the first balanced line 114. The first balanced line 114 receives the signal transmitted by the first unbalanced line 112 through propagation caused by magnetic coupling or the like and supplies the signal to the first mixer 20-1. The first transmission path 140 is connected serially between the first balanced line 114 and the ground potential.

The second coupling line 120 includes a second unbalanced line 122 and a second balanced line 124 formed in parallel. One end of the second unbalanced line 122 is electrically connected to the third transmission path 130 and the other end of the second unbalanced line 122 is open. The second balanced line 124 is disposed together with the second unbalanced line 122 to form the second coupling line 120. For example, the second balanced line 124 may be formed parallel to the second unbalanced line 122 with a prescribed distance therebetween.

One end of the second balanced line 124 on a side of the open end of the second unbalanced line 122 is electrically connected to a ground potential via the second transmission path 150 and the other end of the second balanced line 124 is electrically connected to the second mixer 20-2 via the third terminal 3. Here, the third terminal 3 may be an end portion of the second balanced line 124. The second balanced line 124 receives the signal transmitted by the second unbalanced line 122 through propagation caused by magnetic coupling or the like and supplies the signal to the second mixer 20-2. The second transmission path 150 is connected serially between the second balanced line 124 and the ground potential.

Furthermore, the second coupling line 120 has the same characteristics as the first coupling line 110. For example, the second unbalanced line 122 may have a shape and electrical characteristics that are identical or symmetrical to the first unbalanced line 112. Furthermore, the second balanced line 124 may have a shape and electrical characteristics that are identical or symmetrical to the first balanced line 114. In addition, the distance between the lines in the first coupling line 110 and the distance between the lines in the second coupling line 120 may be equal.

The first coupling line 110 and the second coupling line 120 may have the same even mode impedance and odd mode impedance. Furthermore, the coupling amount in the first coupling line 110 and the second coupling line 120 (for example, the ratio of the levels of the signals propagated to the balanced lines to the levels of the signals transmitted in the unbalanced lines) may be the same.

The first unbalanced line 112 and the second unbalanced line 122 may have a line length (electrical length) that is a quarter of the wave length of the local signal to be input or may be an integer multiple of the aforementioned length. The first balanced line 114 and the second balanced line 124 may have the same line length as the first unbalanced line 112 and the second unbalanced line 122.

The third transmission path 130 is connected serially between the first coupling line 110 and the second coupling line 120. Specifically, the third transmission path 130 is connected serially between the first unbalanced line 112 and the second unbalanced line 122.

The first transmission path 140, the second transmission path 150, and the third transmission path 130 may be formed in a manner such that an amplitude characteristic from among the signal passing characteristics S12 from the first terminal 1 to the second terminal 2 is the same as an amplitude characteristic of the signal passing characteristics S13 from the first terminal 1 to the third terminal 3 and such that a phase characteristic from among the signal passing characteristics S12 is a characteristic having an inverted phase in relation to a phase characteristic of the signal passing characteristics S13. An inverted phase may indicate that the phase is 180 degrees different, for example. Furthermore, the first transmission path 140, the second transmission path 150, and the third transmission path 130 may have impedances that are adjusted in a manner to set the amplitudes of the local signal Lo and the inverted local signal /Lo to be the same and the phases thereof to be inverted, for example. The impedance may be adjusted by adjusting the line length of each transmission line. The signal passing characteristics (S12 and the like) may indicate so-called S parameters.

Through the configuration of the frequency converting apparatus 10 of the present embodiment, even in a case where the local signal Lo and the inverted local signal/Lo leak into the output section 40, the signals cancel each other out in the output section 40. Furthermore, the signal to be modulated and the inverted component thereof also cancel each other out in the same manner. The output section 40 can eliminate unnecessary components to accurately output the modulated signal because a component obtained by multiplying the local signal by the signal to be modulated has the same phase as the signal obtained by multiplying the inverted local signal by the inverted signal to be modulated.

The frequency converting apparatus 10 shown in FIG. 1 has an IF signal as input and an RF signal as output, but, as another example, the frequency converting apparatus 10 may have an RF signal as the input and an IF signal as the output. Through such a structure as well, the unnecessary components can be eliminated to output the accurate modulated signal in the same manner as described above.

In such a case, the first signal input section 30 can function as a signal output section. Furthermore, the output section 40 functions as a signal input section that supplies the received RF signal to the drain terminals of the first mixer 20-1 and the second mixer 20-2 in-phase. The signal output section (first signal input section 30) in such a case may have the same configuration as the balun circuit 100. In the following, the signal output section has the same configuration as the balun circuit 100 and a function of the signal output section using each structural element of the balun circuit 100 is described.

In such a case, the terminal 14 corresponds to the first terminal 1. Furthermore, in the signal output section, the end portion of the balanced line connected to the drain terminal of the first mixer 20-1 corresponds to the second terminal 2 and the end portion of the balanced line connected to the drain terminal of the second mixer 20-2 corresponds to the third terminal 3.

In the signal output section, the first transmission path 140, the second transmission path 150, and the third transmission path 130 are formed in a manner such that an amplitude characteristic from among the signal passing characteristics S21 from the second terminal 2 to the first terminal 1 is the same as an amplitude characteristic of the signal passing characteristics S31 from the third terminal 3 to the first terminal 1 and such that a phase characteristic from among the signal passing characteristics S21 is a characteristic having an inverted phase in relation to a phase characteristic of the signal passing characteristics S31.

In addition, the first transmission path 140, the second transmission path 150, and the third transmission path 130 may be formed in a manner such that the balun circuit 100 can function as both the signal input section and the signal output section. In other words, the first transmission path 140, the second transmission path 150, and the third transmission path 130 may be formed in a manner such that the signal passing characteristics S12 and the signal passing characteristics S13 have the same amplitude characteristics and inverted phase characteristics, and also formed in a manner such that signal passing characteristics S21 and the signal passing characteristics S31 have the same amplitude characteristics and inverted phase characteristics.

Figure 2:
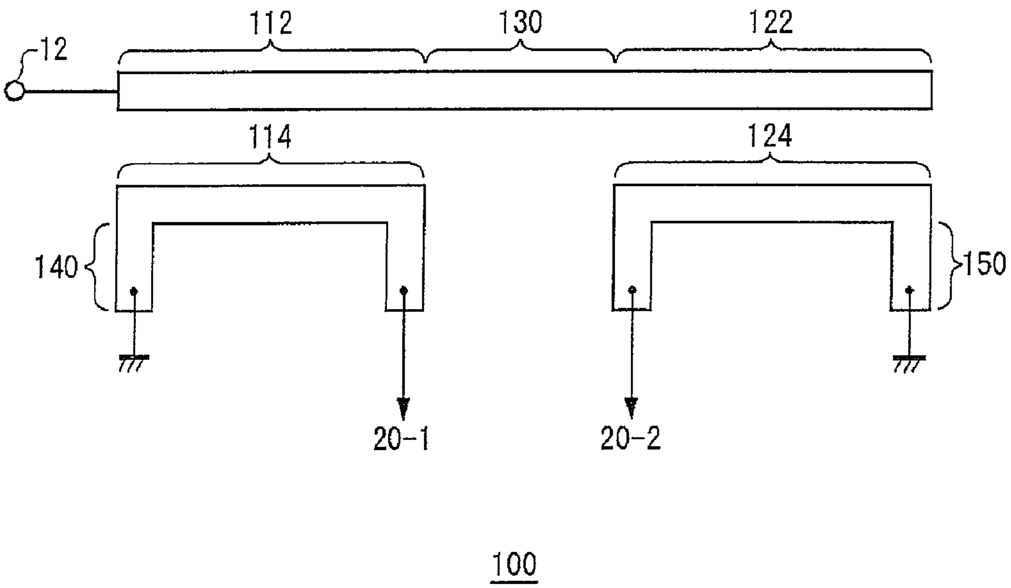
FIG. 2(*a*) shows an example of an overall configuration of a balun circuit 100.
Figure 2:
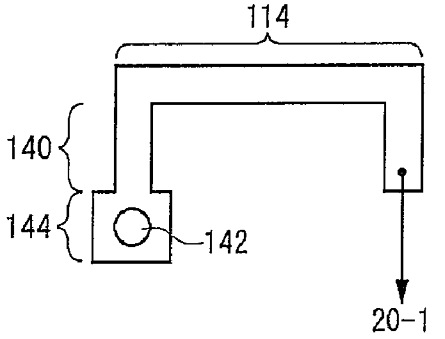

FIG. 2 shows an exemplary configuration of the balun circuit 100. FIG. 2(*a*) shows an example of an overall configuration of the balun circuit 100. FIG. 2(*b*) shows an exemplary configuration of the first balanced line 114 and the first transmission path 140. In the balun circuit 100 of the present embodiment, the first unbalanced line 112, the third transmission path 130, and the second unbalanced line 122 are formed as a single body having a uniform line width.

The first unbalanced line 112, the third transmission path 130, and the second unbalanced line 122 may be pattern wirings formed on a semiconductor substrate, for example. In FIG. 2(*a*), an example is shown in which the first unbalanced line 112, the third transmission path 130, and the second unbalanced line 122 are formed in a straight line, but, as another example, the aforementioned lines may be formed in an arbitrary pattern such as a spiral or a kinked line.

The first balanced line 114 is formed parallel to the first unbalanced line 112 with a prescribed distance therebetween. The first transmission path 140 is formed in a manner to extend from an end portion of the first balanced line 114 and has the same line width as the first balanced line 114. The first transmission path 140 of the present embodiment is formed in a manner to extend from the end portion of the first balanced line 114 in a direction away from the first unbalanced line 112. For example, the first transmission path 140 may be formed in a manner to extend in a direction perpendicular to the first unbalanced line 112.

As shown in FIG. 2(*b*), the end portion of the first transmission path 140 may be connected to a pad 144 in which a via hole 142 is formed. The via hole 142 connects the ground layer to the pad 144. Furthermore, an end portion of the second transmission path 150 may have the same configuration.

The second balanced line 124 is formed to have the same line width as the first balanced line 114 and is formed parallel to the second unbalanced line 122 with a prescribed distance therebetween. The second transmission path 150 is formed in a manner to extend from an end portion of the second balanced line 124 and to have the same line width as the second balanced line 124. The second transmission path 150 of the present embodiment is formed in a manner to extend from the end portion of the second balanced line 124 in a direction away from the second unbalanced line 122. For example, the second transmission path 150 may be formed in a manner to extend in a direction perpendicular to the second unbalanced line 122.

The first transmission path 140, the second transmission path 150, the first balanced line 114, and the second balanced line 124 may be pattern wirings formed on a semiconductor substrate, for example. Here, the shape of the first balanced line 114 and the second balanced line 124 is not limited to a straight line, and many different shapes may be adopted to conform to the shape of the first unbalanced line 112 and the second unbalanced line 122.

As described above, the line lengths (electrical lengths) of the first transmission path 140, the second transmission path 150, and the third transmission path 130 are each determined such that the signal passing characteristics S12 and the signal passing characteristics S13 of the balun circuit 100 have the same amplitude characteristics and inverted phase characteristics and/or the signal passing characteristics S21 and the signal passing characteristics S31 have the same amplitude characteristics and inverted phase characteristics.

For example, each line length may be obtained through a widely known electromagnetic analysis simulation in a manner such that the relationships of the amplitude characteristics and the phase characteristics are the prescribed relationships. Furthermore, in a case where the line lengths of the first transmission path 140, the second transmission path 150, and the third transmission path 130 are each fluctuated in unit quantities, the amount of fluctuation of each amplitude characteristic and phase characteristic may be measured in advance or a simulation may be executed by calculating the amount of fluctuation of each amplitude characteristic and phase characteristic in advance from the design information.

The amount of fluctuation may be obtained in advance for every frequency of the input signal and for every signal level. Furthermore, the line lengths of the first transmission path 140 and the second transmission path 150 are each independently adjusted. Therefore, the line lengths of the first transmission path 140 and the second transmission path 150 may be different lengths.

A designer may design the configuration of the balun circuit 100 based on a result of the aforementioned simulation. Furthermore, in a case where the frequency of the input local signal changes within a constant range, the first transmission path 140, the second transmission path 150, and the third transmission path 130 may be formed to conform to a central frequency of the range.

Through the balun circuit 100 having such a configuration, a local signal and an inverted local signal having substantially the same signal levels and inverted phases can be accurately generated using wires having uniform line widths. Furthermore, the balun circuit 100 can be easily designed because wires having uniform line widths are used.

Figure 3:
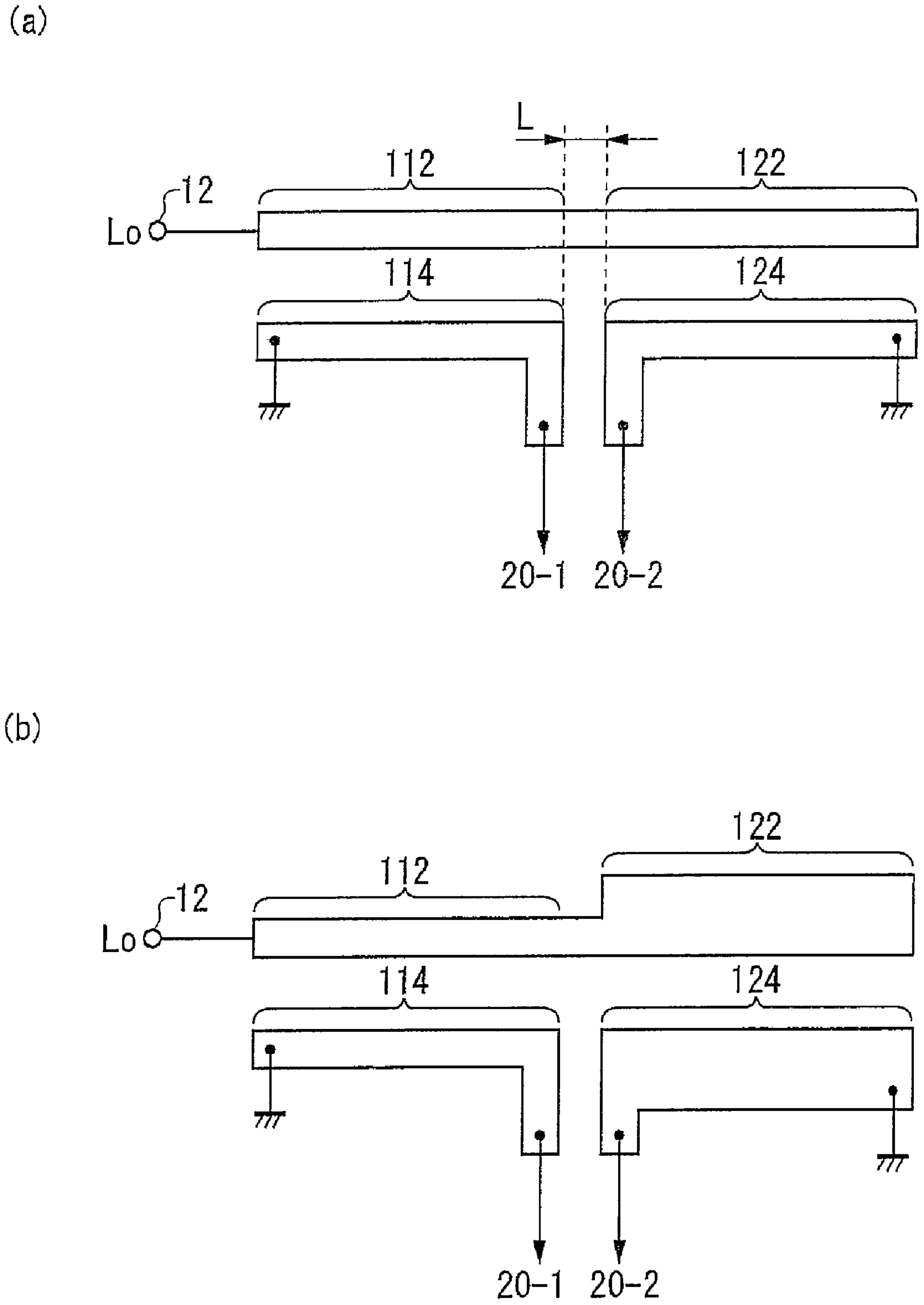
FIG. 3(*a*) shows an example of the balun circuit not provided with the first transmission path 140, a second transmission path 150, and a third transmission path 130.

FIG. 3 shows an exemplary configuration of a balun circuit that is not provided with the first transmission path 140, the second transmission path 150, and the third transmission path 130. FIG. 3(*a*) shows an example of the aforementioned balun circuit. Generally, because a line length L between the first unbalanced line 112 and the second unbalanced line 122 causes a phase error, it is desirable that the line length L be as short as possible. Furthermore, it is generally desirable that the first balanced line 114 and the second balanced line 124 be grounded at an area in a proximity of the end portions thereof.

Through such a configuration, the differential local signal and inverted local signal can be accurately generated as long as decay of the local signal in the first unbalanced line 112 is not taken into account. In reality, however, it is difficult to accurately generate the differential local signal and inverted local signal through the balun circuit having the aforementioned configuration because the local signal decays in the first unbalanced line 112.

FIG. 3(*b*) shows another example of the balun circuit. In the balun circuit, the coupling amount is increased by adjusting the line length of the second unbalanced line 122 and the second balanced line 124 to compensate for the decay of the local signal in the first unbalanced line 112 described above.

Through such a configuration, the differential local signal and inverted local signal can be accurately generated, but it is difficult to adopt a kinked line shape or the like to ensure line length. Relative to the balun circuit shown in FIG. 3, the differential local signal and inverted local signal can be accurately generated and the wiring pattern can be easily designed through the balun circuit 100 described in FIG. 2.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above description, through the embodiments described above, a balun circuit can be realized that can accurately generate differential signals and for which a wiring pattern can be easily designed.

What is claimed is:

1. A balun circuit disposed between a first terminal, a second terminal, and a third terminal, comprising:

a first coupling line in which an unbalanced line thereof is connected to the first terminal and a balanced line thereof is electrically connected to the second terminal;

a second coupling line having characteristics identical to those of the first coupling line in which an unbalanced line thereof is electrically connected to the unbalanced line of the first coupling line and a balanced line thereof is electrically connected to the third terminal;

a first transmission path that is serially connected between the balanced line of the first coupling line and a ground potential and extends in a direction away from the balanced line of the first coupling line;

a second transmission path that is serially connected between the balanced line of the second coupling line and a ground potential and extends in a direction away from the balanced line of the second coupling line, the length of the second transmission path being different from the length of the first transmission path; and a third transmission path that is serially connected between the unbalanced line of the first coupling line and the unbalanced line of the second coupling line, wherein the first transmission path, the second transmission path, and the third transmission path are formed in a manner and the lengths of the first transmission path and the second transmission path are adjusted in a manner such that an amplitude characteristic from among signal passing characteristics from the first terminal to the second terminal is the same as an amplitude characteristic of signal passing characteristics from the first terminal to the third terminal and such that a phase characteristic from among the signal passing characteristics from the first terminal to the second terminal is a characteristic having an inverted phase in relation to a phase characteristic of the signal passing characteristics from the first terminal to the third terminal.

2. The balun circuit according to claim 1, wherein the first transmission path, the second transmission path, and the third transmission path are further formed in a manner such that an amplitude characteristic from among signal passing characteristics from the second terminal to the first terminal is the same as an amplitude characteristic of signal passing characteristics from the third terminal to the first terminal and such that a phase characteristic from among the signal passing characteristics from the second terminal to the first terminal is a characteristic having an inverted phase in relation to a phase characteristic of the signal passing characteristics from the third terminal to the first terminal.

3. The balun circuit according to claim 1, wherein the first coupling line includes a first unbalanced line having one end thereof connected to the first terminal and another end thereof connected to the third transmission path and a first balanced line disposed together with the first unbalanced line to form the first coupling line and having one end thereof connected to the first transmission path and another end thereof connected to the second terminal, and the second coupling line includes a second unbalanced line with characteristics identical to those of the first unbalanced line having one end thereof connected to the third transmission path and another end thereof left open and a second balanced line disposed together with the second unbalanced line to form the second coupling line, which has characteristics identical to those of the first coupling line, and having one end thereof connected to the second transmission path and another end thereof connected to the third terminal.

4. The balun circuit according to claim 3, wherein the first unbalanced line, the second unbalanced line, the first balanced line, the second balanced line, and the third transmission path are pattern wirings formed on a circuit board, the first unbalanced line, the third transmission path, and the second unbalanced line are formed as a single body having uniform width, the first balanced line is formed parallel to the first unbalanced line with prescribed distance therebetween, and the second balanced line is formed parallel to the second unbalanced line with a prescribed distance therebetween and has a width identical to that of the first balanced line.

5. The balun circuit according to claim 4, wherein the first transmission path and the second transmission path are wiring patterns formed on the circuit board, the first transmission path is formed in a manner to extend from an end portion of the first balanced line and has a width identical to that of the first balanced line, and the second transmission path is formed in a manner to extend from an end portion of the second balanced line and has a width identical to that of the second balanced line.

6. The balun circuit according to claim 5, wherein the first transmission path, the second transmission path, and the third transmission path each have a line length determined in a manner such that an amplitude characteristic from among the signal passing characteristics from the first terminal to the second terminal is the same as an amplitude characteristic of the signal passing characteristics from the first terminal to the third terminal and such that a phase characteristic from among the signal passing characteristics from the first terminal to the second terminal is a characteristic having an inverted phase in relation to a phase characteristic of the signal passing characteristics from the first terminal to the third terminal.

7. The balun circuit according to claim 1, wherein the first coupling line and the second coupling line have the same odd mode impedance and the same even mode impedance.

8. A balun circuit disposed between a first terminal, a second terminal, and a third terminal, comprising:

a first coupling line in which an unbalanced line thereof is connected to the first terminal and a balanced line thereof is electrically connected to the second terminal;

a second coupling line having characteristics identical to those of the first coupling line in which an unbalanced line thereof is electrically connected to the unbalanced line of the first coupling line and a balanced line thereof is electrically connected to the third terminal;

a first transmission path that is serially connected between the balanced line of the first coupling line and a ground potential and extends in a direction away from the balanced line of the first coupling line;

a second transmission path that is serially connected between the balanced line of the second coupling line and a ground potential and extends in a direction away from the balanced line of the second coupling line, the length of the second transmission path being different from the length of the first transmission path; and a third transmission path that is serially connected between the unbalanced line of the first coupling line and the unbalanced line of the second coupling line, wherein the first transmission path, the second transmission path, and the third transmission path arc formed in a manner and the lengths of the first transmission path and the second transmission path are adjusted in a manner such that an amplitude characteristic from among signal passing characteristics from the second terminal to the first terminal is the same as an amplitude characteristic of signal passing characteristics from the third terminal to the first terminal and such that a phase characteristic from among the signal passing characteristics from the second terminal to the first terminal is a characteristic having an inverted phase in relation to a phase characteristic of the signal passing characteristics from the third terminal to the first terminal.

9. A frequency converting apparatus that outputs a modulated signal obtained by shifting a frequency of a signal to be modulated according to a frequency of a local signal, comprising:

a first signal input section that receives the signal to be modulated;

a second signal input section that receives the local signal;

a mixer that modulates the signal to be modulated based on the local signal; and a signal output section that outputs the modulated signal based on the signal generated by the mixer, wherein at least one of the first signal input section and the second signal input section is a balun circuit disposed between a first terminal, a second terminal, and a third terminal, wherein the balun circuit includes:

a first coupling line in which an unbalanced line thereof is connected to the first terminal and a balanced line thereof is electrically connected to the second terminal;

a second coupling line having characteristics identical to those of the first coupling line in which an unbalanced line thereof is electrically connected to the unbalanced line of the first coupling line and a balanced line thereof is electrically connected to the third terminal;

a first transmission path that is serially connected between the balanced line of the first coupling line and a ground potential and extends in a direction away from the balanced line of the first coupling line;

a second transmission path that is serially connected between the balanced line of the second coupling line and a ground potential and extends in a direction away from the balanced line of the second coupling line, the length of the second transmission path being different from the length of the first transmission path; and a third transmission path that is serially connected between the unbalanced line of the first coupling line and the unbalanced line of the second coupling line, wherein the first transmission path, the second transmission path, and the third transmission path arc formed in a manner and the lengths of the first transmission path and the second transmission path are adjusted in a manner such that an amplitude characteristic from among the signal passing characteristics from the first terminal to the second terminal is the same as an amplitude characteristic of the signal passing characteristics from the first terminal to the third terminal and such that a phase characteristic from among the signal passing characteristics from the first terminal to the second terminal is a characteristic having an inverted phase in relation to a phase characteristic of the signal passing characteristics from the first terminal to the third terminal.

10. A frequency converting apparatus that outputs a modulated signal obtained by shifting a frequency of a signal to be modulated according to a frequency of a local signal, comprising:

a second signal input section that receives the local signal;

a mixer that modulates the signal to be modulated based on the local signal; and a signal output section that outputs the modulated signal based on the signal generated by the mixer, wherein the signal output section is a balun circuit disposed between a first terminal, a second terminal, and a third terminal, wherein the balun circuit includes:

a first coupling line in which an unbalanced line thereof is connected to the first terminal and a balanced line thereof is electrically connected to the second terminal;

a second coupling line having characteristics identical to those of the first coupling line in which an unbalanced line thereof is electrically connected to the unbalanced line of the first coupling line and a balanced line thereof is electrically connected to the third terminal;

a first transmission path that is serially connected between the balanced line of the first coupling line and a ground potential and extends in a direction away from the balanced line of the first coupling line;

a second transmission path that is serially connected between the balanced line of the second coupling line and a ground potential and extends in a direction away from the balanced line of the second coupling line, the length of the second transmission oath being different from the length of the first transmission path; and a third transmission path that is serially connected between the unbalanced line of the first coupling line and the unbalanced line of the second coupling line, wherein the first transmission path, the second transmission path, and the third transmission path are formed in a manner and the lengths of the first transmission path and the second transmission path are adjusted in a manner such that an amplitude characteristic from among the signal passing characteristics from the second terminal to the first terminal is the same as an amplitude characteristic of the signal passing characteristics from the third terminal to the first terminal and such that a phase characteristic from among the signal passing characteristics from the second terminal to the first terminal is a characteristic having an inverted phase in relation to a phase characteristic of the signal passing characteristics from the third terminal to the first terminal.

* * * * *